(12) United States Patent
Sicard et al.

(10) Patent No.: US 9,397,658 B2
(45) Date of Patent: Jul. 19, 2016

(54) GATE DRIVE CIRCUIT AND A METHOD FOR CONTROLLING A POWER TRANSISTOR

(71) Applicants: Thierry Sicard, Auzenville Tolosane (FR); Philippe Perruchoud, Tournefeuille (FR)

(72) Inventors: Thierry Sicard, Auzenville Tolosane (FR); Philippe Perruchoud, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 64 days.

(21) Appl. No.: 14/552,573

(22) Filed: Nov. 25, 2014

(65) Prior Publication Data

US 2015/0381167 A1    Dec. 31, 2015

(30) Foreign Application Priority Data

Jun. 25, 2014    (WO) .................. PCT/IB2014/001441

(51) Int. Cl.
```
H03G 3/00       (2006.01)
H03K 17/687     (2006.01)
H02P 27/06      (2006.01)
B60L 11/18      (2006.01)
```
(52) U.S. Cl.
CPC .......... *H03K 17/687* (2013.01); *B60L 11/1803* (2013.01); *H02P 27/06* (2013.01)

(58) Field of Classification Search
CPC ........................... H03G 1/0023; H03G 1/0035
USPC ......... 327/540, 541, 542; 361/91.2, 101, 106; 330/291, 282, 278, 279, 86
See application file for complete search history.

(56) References Cited

U.S. PATENT DOCUMENTS

| | | | | |
|---|---|---|---|---|
| 5,952,887 A * | 9/1999 | Katayanagi | .......... | H03G 3/3084 330/110 |
| 6,404,282 B2 * | 6/2002 | Kikuchi | ................... | H03K 5/02 330/110 |
| 6,462,982 B1 * | 10/2002 | Numata | ................. | G11C 11/15 365/158 |
| 7,157,977 B2 * | 1/2007 | Lee | ........................... | H03F 1/34 250/214 A |
| 7,268,628 B2 * | 9/2007 | Noda | ........................ | H03F 1/34 330/308 |
| 8,841,969 B2 * | 9/2014 | Lee | ...................... | H03G 1/0082 330/279 |
| 9,178,474 B2 * | 11/2015 | Lee | ...................... | H03G 3/3084 |

OTHER PUBLICATIONS

Idir, N. et al., "Active Gate Voltage Control of Turn-on di/dt and Turn-off dv/dt in Insulated Gate Transistors," IEEE Transactions on Power Electronics, vol. 21, No. 4, Jul. 2006, pp. 849-855.

* cited by examiner

*Primary Examiner* — Rita Leykin
(74) *Attorney, Agent, or Firm* — Charlene R. Jacobsen

(57) ABSTRACT

A gate drive circuit drives a control terminal of a power transistor and comprises: a drive terminal for electrically coupling the control terminal, a first reference source, a first switch arranged between the first reference source and the control terminal, a switch control circuit and a measurement circuit. The first switch is switched-on to turn-off the power transistor. The switch control circuit switches-off the first switch during a transition period to a fully off-state. The measurement circuit outputs a control signal to the switch control circuit in response to a value of a voltage at the control terminal measured when a discharge current flowing to the drive terminal has been reduced to a predetermined threshold, for switching-on the first switch if the measured value is smaller than a threshold voltage.

20 Claims, 7 Drawing Sheets

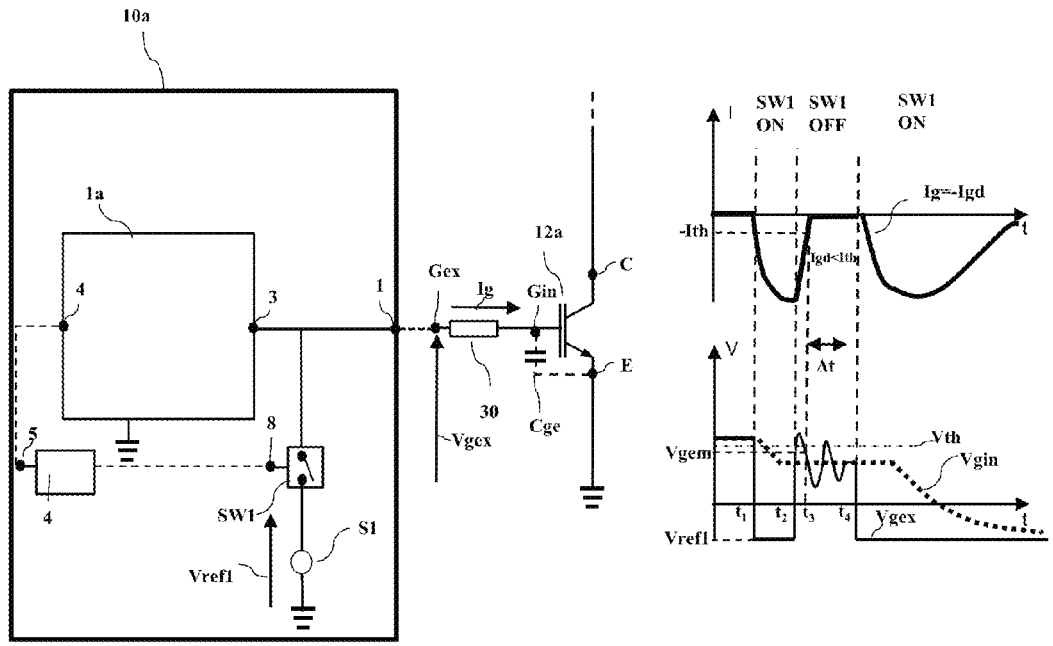
FIG. 1A  FIG. 1B
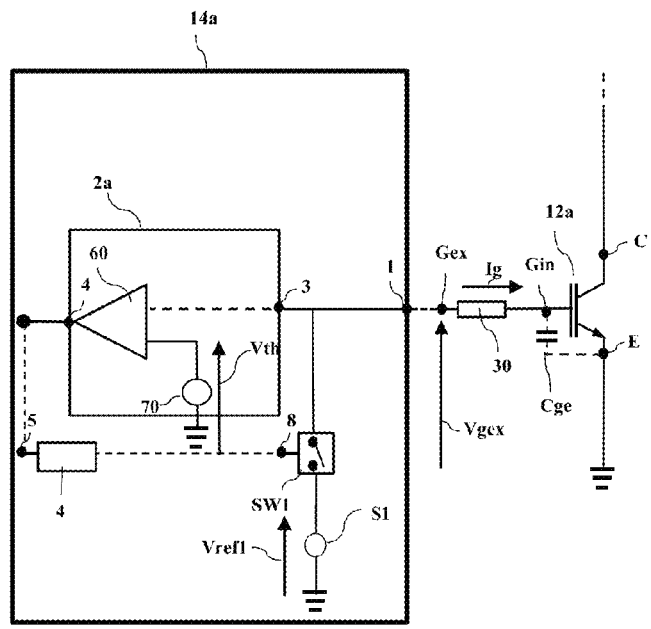
FIG. 2

GATE DRIVE CIRCUIT AND A METHOD FOR CONTROLLING A POWER TRANSISTOR

CROSS REFERENCE TO RELATED APPLICATION(S)

The present application claims priority to International Patent Application No. PCT/IB2014/001441, entitled "A GATE DRIVE CIRCUIT AND A METHOD FOR CONTROLLING A POWER TRANSISTOR," filed on Jun. 25, 2014, the entirety of which is herein incorporated by reference.

FIELD OF THE INVENTION

This invention relates to a gate drive circuit, a power module, a power inverter module, a vehicle and a method of driving a control terminal of a power transistor.

BACKGROUND OF THE INVENTION

During turn-off of a power transistor, over-voltages may be for example generated across the power transistor, e.g. between a collector terminal and an emitter terminal of an Insulated Gate Bipolar Transistor (IGBT) or between a source terminal and a drain terminal of a vertical power Metal Oxide Semiconductor Field Effect Transistor (MOSFET). The over-voltages may cause the destruction of the power transistor or excessively high electromagnetic interferences. In fact, in order to quickly turn-off a power transistor with low switching losses, an internal capacitance of the power transistor (e.g. a gate-emitter capacitance in case of a IGBT) may need to be discharged in a few hundreds of nanoseconds via a current of several amperes flowing from the internal capacitance through the control terminal.

Furthermore, parasitic inductances between the internal capacitance and the control terminal may cause unexpected oscillations causing even stronger electromagnetic interferences.

To solve this problem typically an external resistor of a few ohms is used in series with the control terminal of the power transistor. This limits the discharge current during turn-off, and limits over voltages across the power transistor. However, the overall turn-off time of the power transistor, and as a consequence the switching losses associated with the turn off of the power transistor are increased by the external resistor.

As another solution, Idir, N.; Bausiere, R; Franchaud, J. J., "Active voltage control of turn-on di/dt and turn-off dv/dt in insulated gate transistors," IEEE Transactions on Power Electronics, vol. 21, no. 4, pp. 849-855, July 2006, hereinafter referred to as Idir, discloses a controlled turn-off of an IGBT. The controlled turn-off makes use of an active gate voltage control (AGVC) that generates, during the turn-off of the IGBT, intermediate gate voltage-levels between a full turn-on gate control voltage, typically +15 V for an IGBT transistor, and a full turn-off gate control voltage of 0 V, in order to reduce the over-voltages across the IGBT and at the same time maintaining the overall turn-off time within acceptable levels.

However, a problem associated with this solution is that a complex feedback control loop is required to generate the intermediate gate voltage levels. In fact, the feedback control loop adjusts adaptively the gate control voltage in function of a detected slope change in the output voltage, i.e. the collector voltage in an IGBT, of the power transistor.

SUMMARY OF THE INVENTION

The present invention provides a gate drive circuit, a power module, a power inverter module, a vehicle and a method of driving a control terminal of a power transistor as claimed in the respective claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

FIG. 1A schematically shows a first example of an embodiment of a gate drive circuit.

FIG. 1B shows a time diagram of the voltage and current signals for the example shown in FIG. 1A.

FIG. 2 schematically shows a second example of an embodiment of a gate drive circuit.

Elements in the FIGs. are illustrated for simplicity and clarity and have not necessarily been drawn to scale. In the FIGs., elements which correspond to elements already described may have the same reference numerals.

DETAILED DESCRIPTION OF THE PREFERRED EMBODIMENTS

Figure 3A:
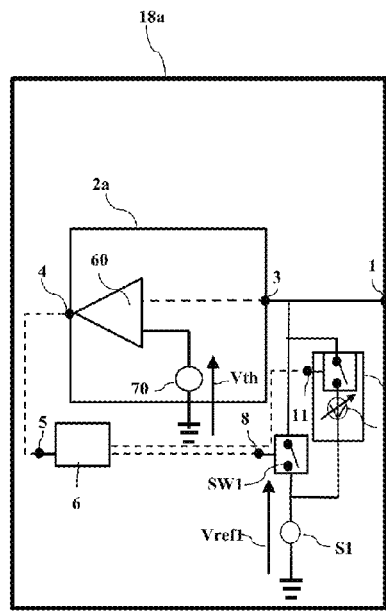
FIG. 3A schematically shows a third example of an embodiment of a gate drive circuit.

FIG. 1A schematically shows an example of an embodiment of a gate drive circuit 10a. The gate drive circuit 10a has a drive terminal 1 electrically coupled to a control terminal Gex of a power transistor 12a for driving the control terminal Gex.

The power transistor 12a of FIG. 1A is an IGBT (Isolated Gate Bipolar Transistor) with a gate terminal Gex, an emitter terminal E and a collector terminal C. However, the power transistor 12a may be any suitable type of power transistor, e.g a Field Effect Transistor (FET) and in particular an N-channel FET, in which case the emitter terminal E is replacing a source terminal and the collector terminal C is replacing a drain terminal. The power transistor may e.g. be a normally off or a normally on FET.

The control terminal Gex may be electrically coupled to an internal control terminal Gin of the power transistor 12a by means of a parasitic component 30. The parasitic component 30 may be for example an internal distributed gate resistance of the power transistor 12a due to a contact resistance between the internal control terminal Gin and the control terminal Gex. The parasitic component 30 may also include a parasitic inductance due for example to the connection inductance between the control terminal Gex and the drive terminal 1. The control terminal Gex may be an external gate terminal accessible by circuits external to the power transistor 12a; e.g. for control by the gate drive circuit 10a. An internal gate to emitter capacitance Cge exists between the internal control terminal Gin, i.e. the internal gate in this example, and the emitter terminal E of the IGBT 12a.

The gate drive circuit 10a includes a first reference source S1, a first switch SW1, a switch control circuit 4 and a measurement circuit 1a. The first reference source S1 generates a first reference voltage Vref1. The first switch SW1 is arranged to electrically couple, when in an on state, the drive terminal 1 to the first reference voltage Vref1 for turning off the power transistor 12a. When the first switch SW1 is arranged in an on state, the first reference source S1 is electrically coupled to the control terminal Gex to provide a low impedance path through the first switch SW1 which provides the first reference voltage Vref1 to the control terminal Gex. The switch control circuit 4 is electrically coupled to a control input 8 of the first switch SW1 for controlling the first switch SW1. The measurement circuit 1a has a measurement input 3 connected to the drive terminal 1 for measuring a voltage Vgex at the control terminal Gex, and measurement output 4 connected to a first input 5 of the switch control circuit 4 to supply a control signal to the switch control circuit 4.

When the power transistor 12a is fully turned off, the power transistor 12a is in a non-conducting state, i.e. except for inevitable leakage current, a current is not allowed anymore to flow with low losses in a main conducting path formed by the collector terminal C and the emitter terminal E of the power transistor 12a. However, a full turn-off of the power transistor 12a will not occur instantaneously after changing the voltage applied to the control terminal Gex when the first switch SW1 is switched on and as a consequence the large current flowing from the collector terminal C to the emitter terminal E of the power transistor 12a will not stop to flow instantaneously either. Thus, some period of time will lapse when the power transistor 12a transits from an on-state to an off-state. In the following, the turn-off period of the power transistor 12a is referred to as a transition period in which a large current is still flowing through the power transistor 12a and after which the power transistor 12a is fully turned-off.

Current flowing between the current terminals of a power transistor is related to the voltage at the internal control terminal Gin with a known relationship. In this respect it should be observed that the gate drive circuit 10a may be external from a die and/or a package where the power transistor 12a may be integrated. The drive terminal 1 may be connected to the control terminal Gex e.g. via bondwires or otherwise.

The internal gate to emitter capacitance Cge is charged when the power transistor 12a is turned-on and discharged during the turn-off of the power transistor 12a. Discharge of the capacitance Cge occurs via a discharge current Igd that is equivalent but opposite in direction to the gate current Ig shown with an arrow in FIG. 1. The discharge current Igd flows from the power transistor 12a through the control terminal Gex towards the drive terminal 1 of the gate drive circuit 10a.

The switch control circuit 4 is arranged to, during the transition period that brings the power transistor 12a to the fully off-state, switch-off the first switch SW1. The discharge current Igd is increased until the point in time the first switch SW1 is switched off, and reduced to a predetermined current threshold after the point in time the first switch SW1 is switched off.

The measurement circuit 1a measures a measured value of the voltage Vgex at the control terminal Gex when the discharge current Idg has been reduced to the predetermined current threshold in response to switching-off the first switch SW1. For example, the measurement circuit 1a may be arranged to measure the value of the voltage Vgex after a specified period of time from the point in time the first switch SW1 has been switched-on. The specified period of time may be known from the characteristics of the power transistor 12a. Alternatively, for example, the specified period of time may start from the point in time the first switch SW1 has been switched-off during the transition period to the fully off-state. The measurement circuit 1a may for example comprise a timer circuit time-controlling a measurement of the voltage Vgex. Alternatively, the measurement circuit 1a may be arranged to measure the discharge current Igd and compare the discharge current Igd with the predetermined current threshold.

The measurement circuit 1a outputs a control signal to the switch control circuit 4 in response to the measured value of the voltage Vgex for switching-on the first switch SW1 if the measured value is smaller than a threshold voltage. After that the first switch SW1 is switched-on the power transistor 12a is lead to the fully off-state.

The measured value of the voltage Vgex obtained by the measurement circuit 1a can give a very accurate estimation of the large current flowing between the current terminals of power transistor 12a during the transition period to the fully off-state. The parasitic component 30 prevents direct access to the internal control terminal Gin and hence a direct measurement of the voltage at the internal control terminal Gin, which in turns, for the known internal voltage to current relationship in the power transistor 12a, gives an estimation of the large current in the main conducting path. When a large discharge current Igd flows through the parasitic component 30, a large voltage difference is obtained between the voltage Vgex at the control terminal Gex and the internal voltage at the internal control terminal Gin. By measuring the voltage Vgex when the Igd has been reduced to a predetermined threshold, the voltage difference is reduced and a more accurate estimation of the large current flowing across the power transistor 12a can be obtained.

The functionality of the example shown in FIG. 1A is better explained through the time diagrams shown in FIG. 1B. FIG. 1B shows the voltage signals and the current signals in the circuit of FIG. 1A. The bottom time diagram schematically shows the internal gate-emitter voltage Vgin (thicker dashed line) and the voltage Vgex (thinner solid line) at the external gate terminal Gex during the turn off period. The top time diagram schematically shows the corresponding gate current Ig versus time during the turn off period.

As it can be seen from these time diagrams, the first switch SW1 is switched on, at time $t_1$, to electrically couple the external control terminal Gex to the first reference source S1. The external control terminal Gex is at a potential equivalent to the first reference source Vref1.

The first reference voltage Vref1 may have any value suitable to bring the power transistor to a fully off state. The first reference voltage Vref may be a negative voltage well below 0 V, for example −5 V or less, such as −10 V or less, e.g. −10V<Vref1<−15 V.

After the time $t_1$, the gate current Ig is negative, i.e. the internal capacitance Cge is discharging and a discharge current Igd flows from the power transistor 12a through the control terminal Gex towards the drive terminal 1. The shape and the rate with which the discharge current Igd increases depends upon the type and the value of the parasitic component 30 and of other parasitic components in the gate drive circuit 10a. When the discharge current Igd has reached a maximum value determined for example by the parasitic resistance of the parasitic component 30, the first switch SW1 is, at time $t_2$, switched off by the switch control circuit 4. The switch control circuit 4 may for example be controlled from a second input (not shown in FIG. 1) different from the first input 5 of the switch control circuit 4 by for example a control device, e.g. a microcontroller or otherwise, to switch on or off the first switch SW1. The control device may for example switch-off the first switch SW1 at time $t_2$ during the turn-off transition period after a period of time $t_2-t_1$ which is long enough to ensure that the discharge current Igd has reached its maximum value.

At time $t_2$ the gate terminal Gex is electrically coupled to the first reference source S1 with a high impedance path through the switched off first switch SW1, so that the discharge current Igd decreases through the high impedance path. Eventually, at time $t_3$, when the discharge current Igd decreases to a predetermined current threshold Ith, the measurement circuit 1a measures the voltage Vgex at the gate terminal Gex to obtain a measured value Vgem of the voltage Vgex at time $t_3$. The first switch SW1 is switched on if the measured value Vgem is found to be smaller than a predetermined threshold Vth. The measured value Vgem is used by the gate control circuit 10a to control the first switch SW1 during the transition period to fully turn-off the power transistor 12a. For example, as explained further below in more detail, the first switch SW1 may be kept in an off state if the measurement circuit 1a measures a measured value Vgem larger than the threshold voltage Vth.

The measured value Vgem at time $t_3$ is an indication of the voltage Vgin at the internal control terminal Gin of the power transistor 12a and thus an indication of the current flowing through the current terminals of the power transistor during the turn-off transition period. Based on this indication, the gate drive circuit 10a takes a decision to switch again on the first switch SW1 if the measured value Vgem has not exceeded the threshold voltage Vth. In this latter case, the power transistor 12a is driven with a lower collector current than if the measured voltage Vgem is larger than the predetermined threshold voltage Vth. Thereby, over-voltages between the collector terminal and the emitter terminal of the power transistor 12a may be supported by the power transistor 12a and the turn-off of the power transistor 12a may continue by switching on the first switch SW1. In other words, the collector current of the IGBT 12a is in this example low enough so that over voltages across the power transistor 12a and electromagnetic interferences caused by said over voltages may not need to be prevented.

Thus, the need for an external resistor to regulate the discharge current during the turn-off transition period of the power transistor 12a is obviated, thus providing a faster turn off control of the IGBT 12a.

Furthermore, compared to the mentioned Idir, the gate drive circuit 10a obviates the need for a complex feedback loop. The new gate drive circuit is simpler and requires overall less components.

The predetermined current threshold Ith may have any suitable value. It is found that when the predetermined current threshold Ith is substantially 0 A, the accuracy with which the measurement circuit 1a measures the internal gate-emitter voltage Vgin is improved. In this latter example, at the instant the discharge current Igd is 0 A, no current flows through the parasitic component 30 to the drive terminal 1. The measured value Vgem of the voltage Vgex at the control terminal Gex is thus equivalent to the internal gate-emitter voltage Vge at the internal gate terminal Gin of the power transistor 12a.

The measurement circuit 1a of the gate drive circuit 10a may be further arranged to measure the voltage Vgex at the control terminal Gex after a predetermined period of time Δt. A start time of the predetermined period of time Δt may coincide with the point in time at which the discharge current Igd has reduced to the predetermined current threshold Ith. By measuring the voltage Vgex at the gate terminal Gex after the predetermined period of time Δt has lapsed, a more stable measure may be obtained by the measurement circuit 1a. When the discharge current Igd has reduced to the predetermined current threshold Ith, the voltage Vgex at the control terminal Gex of the power transistor 12a may not be sufficiently stable to make an accurate measurement. For example, as schematically indicated in the graphs, depending on the parasitic component 30, the voltage Vgex at the control terminal Gex may oscillate around a middle value before settling down to a stable value. For example, if the parasitic component 30 is a series arrangement of a parasitic resistor and a parasitic inductor, then the voltage Vgex at the control terminal Gex is determined by a series LRC circuit formed by the series arrangement of the parasitic resistor, the parasitic inductor, the internal gate to emitter capacitance Cge, and the impedance offered by the first switch SW1 when the first switch SW1 is in an off state. The time diagrams of FIG. 1B are therefore schematic examples of possible time diagrams, many other waveforms are feasible depending on the values and types of parasitic components. Furthermore, IGBTs and other power transistors, such as FET and BJT have a so-called Miller plateau, i.e. a period of time during which the internal gate to emitter voltage Vgin is constant because the internal gate terminal Gin is clamped until sufficient charge is removed from the gate emitter capacitance Cge to fully turn-off the IGBT. In FIG. 1B the Miller plateau is shown by the flat middle portion of the internal gate-emitter voltage Vgin (thick dashed line). The end of the predetermined period of time Δt can be before the end of the duration of the Miller plateau so as to provide a measurement of the voltage Vgex at the gate terminal Gex equivalent to the internal gate-emitter voltage Vgin at the Miller plateau level.

The measurement circuit 1a may be implemented in any manner suitable for the specific implementation.

Referring to FIG. 2, for example, a gate drive circuit 14a comprises a measurement circuit 2a. The measurement circuit 2a comprises a comparator 60 and a threshold voltage source 70 to generate a threshold voltage Vth. For a typical power transistor the threshold voltage Vth may be in a range of 8 to 12 V but other values may be used as well.

The comparator 60 has a first comparator input electrically coupled to the threshold voltage source 70 and a second comparator input electrically coupled to the measurement input 3 for comparing the measured value Vgem (shown in FIG. 1B) of the voltage Vgex with the threshold voltage Vth. An output of the comparator is connected to the measurement output 4. The comparator 60 supplies a control signal to the first input 5 of the switch control circuit 4 for switching on the first switch SW1 if the measured value Vgem is smaller than the threshold voltage Vth.

FIG. 3A schematically shows another example of an embodiment of a gate drive circuit 18a. Compared to FIG. 2, the gate drive circuit 18a of FIG. 3 further comprises a switchable current source 80 connected, in parallel with the first switch SW1, between the drive terminal 1 and the first reference source S1. A switchable control circuit 6 is connected to the first control input 8 of the first switch SW1 and to a second control input 11 of the switchable current source 80. The switchable current source 80 generates a predetermined variable current $I_p$ that may be switched on and off. The switch control circuit 6 may control the first switch SW1 to be in the off state and to switch on the switchable current source 80 if the measured value Vgem of the voltage Vgex at the gate terminal Gex is larger than the threshold voltage Vth. Thereby, the risk of an over-voltage damaging the power transistor may be reduced. More specifically, it has been found that if the measured value Vgem is larger than the threshold voltage Vth, the current through the power transistor may generate during turn-off a high over-voltage that may be destructive for the power transistor 12a or may generate excessively high electromagnetic interferences. By switching on the switchable current source 80 when the measured voltage Vgem is larger than the threshold voltage Vth, the discharge current Igd during the turn-off of the IGBT 12a may be controlled and limited to the predetermined variable current $I_p$ in order to reduce the over-voltage across the power transistor 12a, e.g. the collector to emitter voltage between the collector terminal C and the emitter terminal E of the IGBT will be kept in a safe area. This is illustrated in the FIG. 3B, after the point in time $t_4$ the first switch SW1 is kept in an off state and that the switchable current source 80 may be switched on to pull the control terminal Gex to the predetermined variable current $I_p$.

Figure 3B:
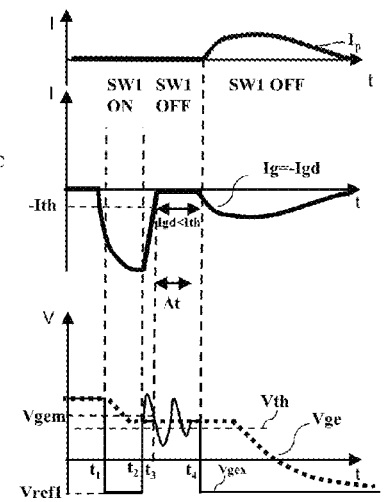
FIG. 3B shows a time diagram of the voltage and current signals for the example shown in FIG. 2A.

The predetermined variable current $I_p$ may have any shape suitable for the specific implementation. For example, as shown in FIG. 3B the predetermined variable current $I_p$ may have a substantially constant current value for a specified period of time after the point in time $t_4$ and decrease slowly to 0 A. For example, the substantially constant current value may be smaller than the discharge current Igd that would be flowing through the first switch SW1 if the first switch SW1 had been switched on.

The turn-off of the power transistor 12a may consist of successive, e.g. two, phases. In each one of the successive phases, the first switch SW1 may be initially switched on and then switched off for a predetermined period of time. By the successive phases of alternatingly switching on and off the first switch SW1, the over-voltage between the terminals C and E in the main conducting path of the power transistor may be reduced. For example, if from the first measurement of the voltage Vgex at the control terminal Gex, the collector current is estimated to be 800 A, the over voltage between the terminal C and the terminal E of the power transistor 12a may be limited to 380 V by executing the turn off of the power transistor in the two successive cycles, i.e. in a sequence of switching on the first switch SW1, switching off the first switch SW1 for a predetermined period of time, switching again on the first switch SW1, switching again off the first switch. The voltage at the gate terminal Gex may be remeasured when the discharge current Igd has reduced again to the predetermined current threshold Ith at the end of the sequence, compared to the threshold voltage Vth and in response to the comparison, the first switch SW1 be controlled as explained above.

Figure 4:
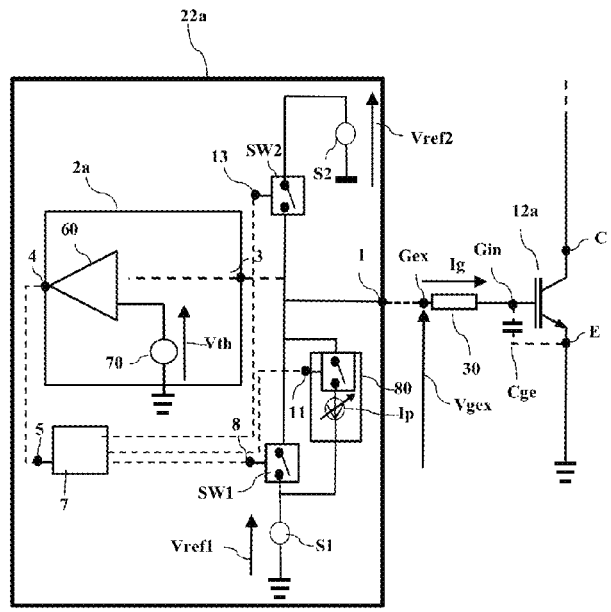
FIG. 4 schematically shows a fourth example of an embodiment of a gate drive circuit.

As shown in FIG. 4, the gate drive circuit 22a may comprise a second reference voltage source S2 to generate a second reference voltage Vref2 and a second switch SW2 arranged between the drive terminal 1 and the second reference voltage source S2. A switchable control circuit 7 is connected to the first control input 8 of the first switch SW1, to the second control input 11 of the switchable current source 80 and to a third control input 13 of the second switch SW2 to switch on or off the second switch SW2. When the second switch SW2 is switched on, the control terminal Gex is electrically coupled to the second reference voltage Vref2. The second switch SW2 may be used to turn on the power transistor 12a. More specifically, if the power transistor 12a is turned on, the second switch SW2 may be switched on and the first switch SW1 may be switched off. During the transition period to the fully turn-off of the power transistor 12a, the first switch SW1 and the second switch SW2 may be both in an off state so that the gate drive circuit 22a provides high impedance to the control terminal Gex. In other words, the first switch SW1 in combination with the second switch SW2 may be operating as an inverter to control the control terminal Gex of the power transistor 12a.

The inverter formed by the first switch SW1 and by the second switch SW2 may operate in three different states: a low state when the first switch SW1 is switched on and the second switch SW2 is switched off, a high state when the first switch SW1 is switched off and the second switch SW2 is switched on, and a high impedance state when the first switch SW1 and the second switch SW2 are both switched off.

Figure 5:
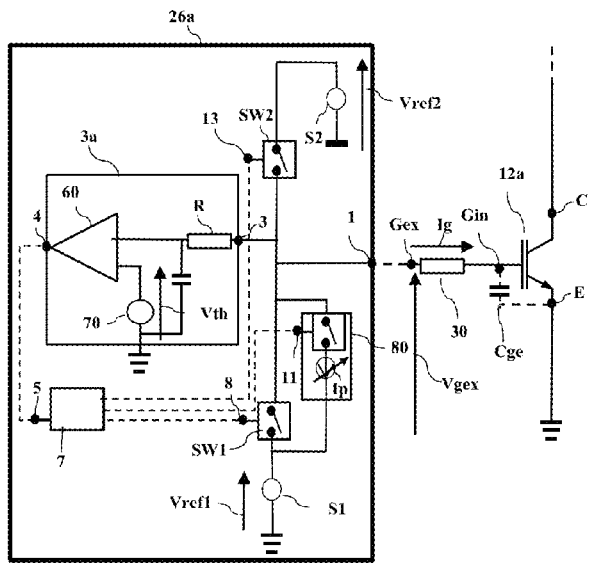
FIG. 5 schematically shows a fifth example of an embodiment of a gate drive circuit.

The gate drive circuit 26a shown in FIG. 5 is similar to the gate drive circuit 22a shown in FIG. 4. The difference is that the gate drive circuit 26a comprises a measurement circuit 3a which further comprise an RC filter at an input 65 of the comparator 60. The RC filter has a resistor R with a first terminal electrically coupled to the measurement input 3 and a second terminal electrically coupled to the second comparator input 65 and to a first terminal of a capacitor C. A second terminal of the capacitor C may be coupled to the common reference potential of the measurement circuit 3a. The RC filter provides a filtered measured value Vgem of the voltage Vgex to the second comparator input 65, i.e. across the capacitor C. Since the voltage Vgex at the gate terminal Gex may oscillate around an average value before stabilizing to the average value, the RC filter may help to obtain a stable and more accurate measurement of the measured value Vgem across the capacitor C of the RC filter. The RC time constant of the RC filter may for example be chosen to be equivalent to 15 ns in order to provide a stable and accurate measurement of the voltage Vgex after 100 ns.

Referring to FIG. 1A or FIG. 3b, the time constant of the RC filter may be used to measure the voltage Vgex at the control terminal Gex after a predetermined period of time equivalent to the settling time of the RC filter from the point in time $t_3$.

The gate drive circuit may be implemented in any suitable manner, and notably in any type of semiconductor circuit. The gate drive circuit may be connected, e.g. in a suitable circuit board, to the power transistor, to obtain for example a power module that can be operated through a connection of the power transistor terminals to external circuitry.

Figure 6:
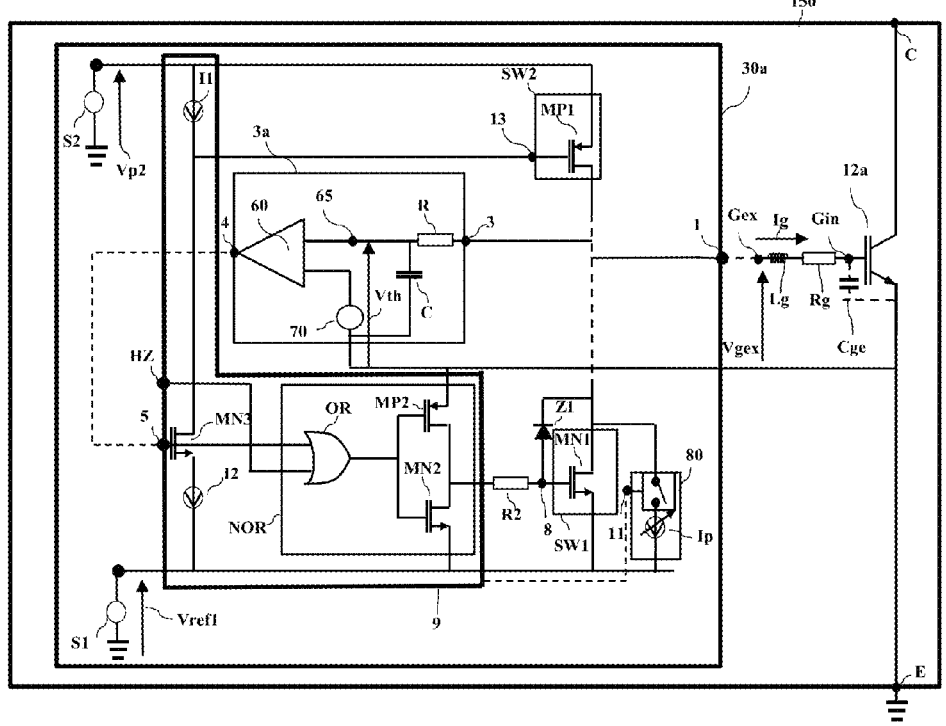
FIG. 6 schematically shows an example of an embodiment of a power module.

FIG. 6 shows for example a power module 150. The power module 150 comprises a gate drive circuit 30a, the measurement circuit 3a and a switch control circuit 9.

In the gate drive circuit 30a, the first switch SW1 is a NMOS device MN1 and the second SW2 is a PMOS device MP1. The NMOS device MN1 has a source terminal electrically coupled to the first reference source S1 and a drain terminal electrically coupled to the control terminal Gex via the drive terminal 1. The PMOS device MP1 has a drain terminal electrically coupled to the control terminal Gex and a source terminal electrically coupled to the second reference source S2. However, the circuit may also be suing e.g. CMOS, bipolar or other suitable components. The gate drive circuit 30a includes, among other extra components, a further resistor R2 and a voltage limiter Z1. The further resistor R2 is in series with a gate terminal of the NMOS device MN1. The voltage limiter Z1 is arranged between the gate terminal 8 of the NMOS device MN1 and the gate terminal Gex of the power transistor 12a so as to limit the voltage Vgex at the control terminal Gex to a clamp voltage. The voltage limiter Z1 may for example be a zener diode with a cathode electrically coupled to the control terminal Gex and with an anode connected to the gate terminal of the NMOS device MN1.

The switch control circuit 9 is electrically connected to the first control input 8 and to the second control input 13 and electrically coupled to the third control input 11. The switch control circuit 9 comprises control circuitries used to control the first switch SW1 at the first control input 8 and the second switch SW2 at the second control input 13. For simplicity, control circuitries used to control the switchable current source 80 at the third control input 11 are omitted. The switch control circuit 9 comprises a NOR gate, a first current source I1, a second current source I2 and a control NMOS device MN3.

The NOR gate comprises an OR gate and an inverter. The inverter has an output electrically coupled to a terminal of the further resistor R2 and an input electrically coupled to an output of the OR gate. The inverter comprises a second NMOS device MN2 and a second PMOS device MP2 connected in an inverter configuration. A drain terminal of the second PMOS device MP2 is electrically coupled to the terminal E of the power transistor 12a. A source terminal of the second NMOS device MN2 is electrically coupled to the first reference voltage source S1. The OR gate has two input terminals: the first input 5 and a second input HZ. The first input 5 is electrically coupled to the measurement output 4, i.e. to the output of the comparator 60. A first control signal may be supplied to the first input 5 to set a low or high state of the gate drive circuit 30a through the first current source I1, the second current source I2 and the control NMOS device MN3. A control device, e.g. a microcontroller, may control the second input HZ. A second control signal may be supplied by the control device to the second input HZ to set the gate drive circuit 30a in a high impedance state. The first current source I1 is connected between a gate terminal of the PMOS device MP1 and a positive terminal of the second reference voltage source S2. The first current source I1 pulls up the gate terminal of the PMOS device MP1 to switch off the PMOS device MP1 when the first input 5 is in a low state to keep the control NMOS device MN3 switched off. The second current source I2 provides a low conductive path between the gate terminal of the PMOS device MP1 and the first reference voltage source S1 when the control NMOS device MN3 is switched on, i.e. when the first input 5 is driven in the high state. In this latter case the PMOS device MP1 is switched on.

The functionality of the gate drive circuit 30a during turn-off of the IGBT 12a will be explained with reference to the time diagram of FIG. 7.

Figure 7:
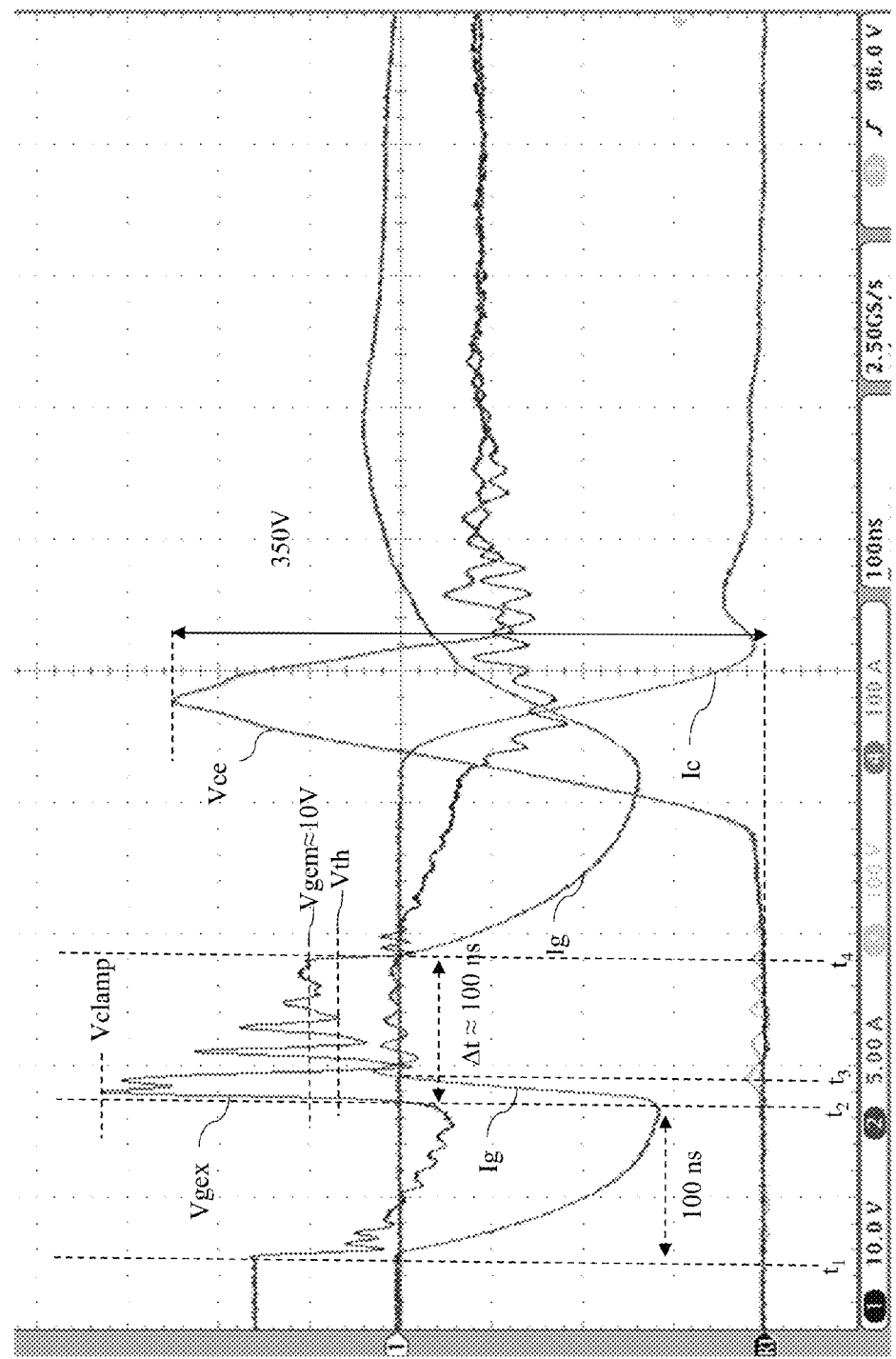
FIG. 7 schematically shows a time diagram of voltages and currents occurring during the turn-off of a power transistor controlled with the power module shown in FIG. 6.

FIG. 7 shows the time diagram of the gate current Ig, the collector to emitter voltage Vice, the voltage Vgex at the gate terminal Gex and the collector current Ic during turning off the IGBT 12a. The gate drive circuit 30a shown in FIG. 6 may control the turn-off of the IGBT 12a according to the time diagram shown in FIG. 7.

At time $t_1$, when the first input 5 goes from a high state to a low state, the output of the inverter goes from a high state to a low state, i.e. the control terminal Gex is forced to a low state. If the first reference voltage source Vref1 is −10 V and the second reference voltage source Vref2 is +15 V, the output of the gate drive circuit 30a switches from +15 V to −10 V. The gate to emitter capacitor Cge of the power transistor 12a may be discharged through the parasitic resistor Rg and the parasitic inductor Lg. The parasitic inductor Lg limits the slope of the gate current Ig, i.e. dIg/dt, so that the gate current Ig may need some time, in FIG. 7 approximately 100 ns, to reach a maximum negative value limited by the parasitic resistor Rg. In FIG. 7 this maximum negative value is approximately 14 A. At time $t_2$ the second input may be set to a high state so that the first switch SW1 may be switched off when the second switch SW2 is still switched off. The inverter formed by the first and second switches SW1 and SW2 is in this latter case controlled to be in the high impedance state. Since the parasitic inductor stored energy during the previous phase, at time $t_2$ the gate current Ig flowing through the parasitic inductor Lg cannot stop to flow immediately. The voltage across the parasitic inductor Lg needs to change polarity before the gate current Ig can be reduced to the predetermined current threshold Ith, e.g. to substantially 0 A. The discharge current Igd stored in the parasitic inductor Lg thus flows from the gate terminal Gex to the drive terminal 1, forcing the NMOS device MN1 to be in a conductive linear state through the biased further resistor R2 and the voltage limiter Z1. During a reduction of the discharge current Igd, i.e. from the point in time $t_2$ to the point in time $t_3$, the voltage Vgex at the control terminal Gex is limited to a clamp voltage Vclamp by the voltage limiter Z1. In the example of FIG. 6, the first reference voltage Vref1 may be −10 V and the zener diode Z1 may be a 40 V zener diode, in which case the voltage Vgex at the control terminal Gex of the power transistor 12a may be clamped to a clamped voltage Vclamp equivalent to 30 V above the voltage present at the emitter E of the power transistor 12a.

When the gate current Ig reaches substantially 0 A, at time $t_3$, the voltage Vgex at the control terminal Gex is equivalent to the voltage at the internal control terminal Gin because no more current flows in the control path, i.e. the gate path in a IGBT. Due to sharp transitions during turn-off of the power transistor 12a and due to the parasitic components (e.g. the resistor Rg and the parasitic inductor Lg) the voltage Vgex at the control terminal Gex may exhibit some oscillations. The RC filter at the input of the comparator 60 may filter out those oscillations to obtain a clean filtered measured value Vgem of the voltage Vgex. The filtered measured value Vgem, in the example of FIG. 7 substantially equivalent to 10 V, may then be compared by the comparator 60 with the threshold voltage Vth.

The comparator 60 checks, if the discharge current is smaller than predetermined current threshold Ith, whether the measured value Vgem is larger or smaller than the threshold voltage Vth. If the measured value Vgem is larger than the threshold voltage Vth, the power transistor 12a drives a high collector current and the gate drive circuit 30a will continue to turn off the power transistor 12a with less gate current by switching on the switchable current source 80. In other words, when the measured value Vgem is larger than the threshold voltage Vth the gate drive circuit 30a may implement a soft turn off by controlling the predetermined variable current Ip of the switchable current source 80 to limit the collector to emitter over-voltage of the collector to emitter voltage Vce. The soft turn off may reduce the collector to emitter over-voltage by slowing down the turning off of the power transistor 12a.

If the measured voltage Vgem is smaller than the threshold voltage Vth, as in the example of FIG. 7, the power transistor 12a drives a low collector current and the power transistor 12a may continue, after time $t_4$, to turn off, i.e. with the output of the NOR gate in a high state and the NMOS device MN1 switched on. In this example, since the IGBT 12a drives a low collector current a fast turn off may be executed and still the collector to emitter over-voltage be limited to acceptable values. In FIG. 7 it is shown that the over-voltage of the collector to emitter voltage Vce is in this example limited to 350 V.

Figure 8:
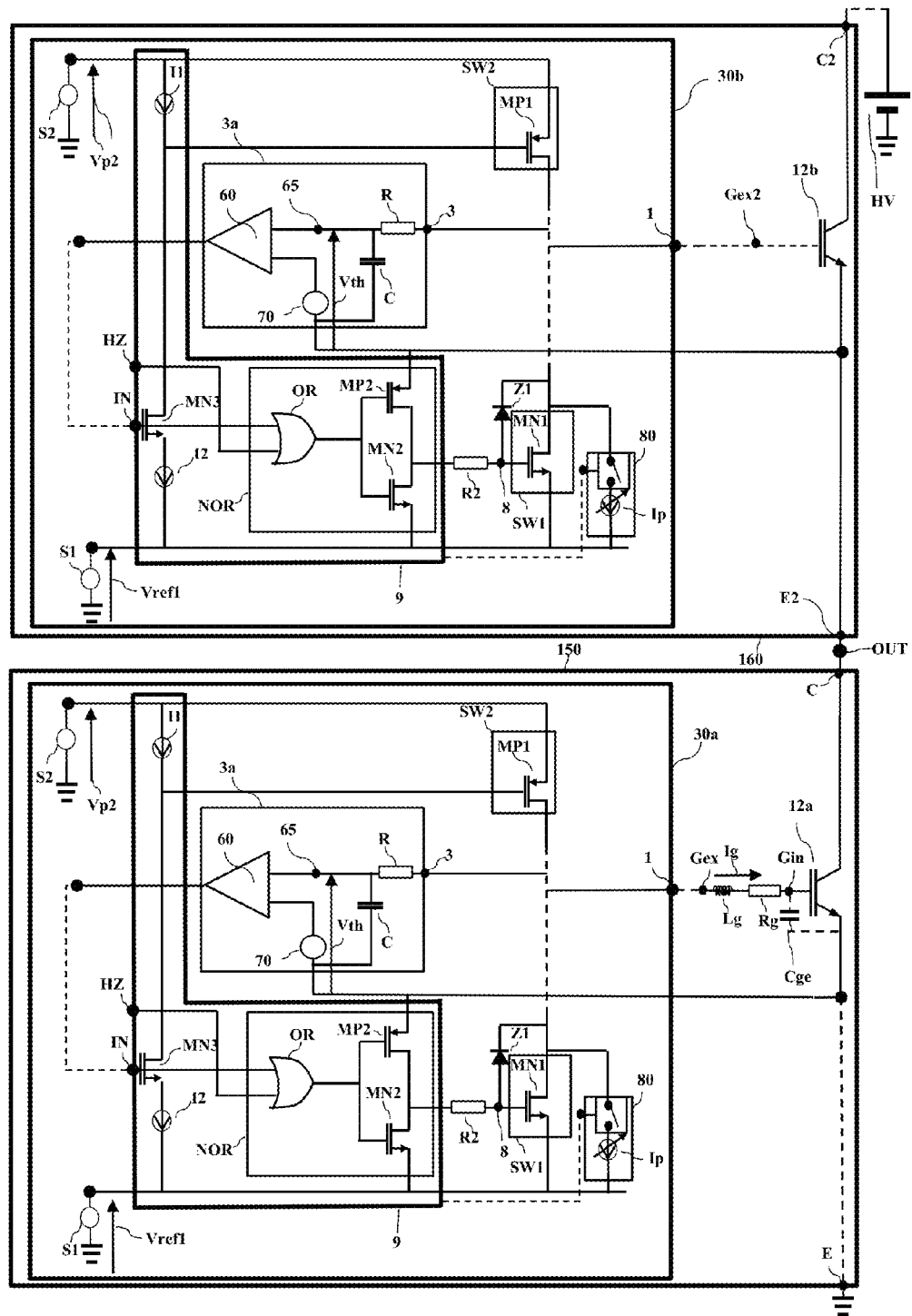
FIG. 8 schematically shows an example of a power inverter module.

FIG. 8 schematically shows a power inverter module. The power inverter module shown in FIG. 8 includes the power module 150 described through FIG. 6 and an identical power module 160. The power module 150 comprises a low side IGBT 12a at a low side. The low side IGBT 12a is connected with a high side IGBT 12b of the power module 160 in a power inverter topology. The high side IGBT 12b is connected in series at a high side between a high supply voltage HV and the low side IGBT 12a. A gate terminal Gex2 of the IGBT 12b is electrically coupled to a further gate drive circuit 30b similar to the gate drive circuit 30a. An emitter terminal E2 of the high side IGBT 12b is electrically coupled to the collector terminal C of the low side IGBT 12a. A collector terminal C2 of the high side IGBT 12b is electrically coupled to a high supply voltage HV. The supply voltage HV powers the power inverter. An output node OUT of the power inverter module is used alone or in combination with similar parallel power inverter modules to drive a load (not shown in FIG. 8). The low side IGBT 12a and the high side IGBT 12b may not be simultaneously turned on during driving the load. In this way a short circuit directly connecting the supply voltage HV to the common reference potential is avoided. The power inverter module may be configured to have the low side IGBT 12a or the high side IGBT 12b alternatingly turned on. It should be noted that a potential of the output node OUT of the power inverter module may change of several hundred volts, e.g. from the common reference potential to the high voltage supply HV. As indicated in FIG. 8 by the solid line connection drawn from the emitter terminal E2 which corresponds to the output OUT of the power inverter to the further gate drive circuit 30b, the output OUT of the power inverter is a reference potential used by the further gate drive circuit 30b.

Figure 9:
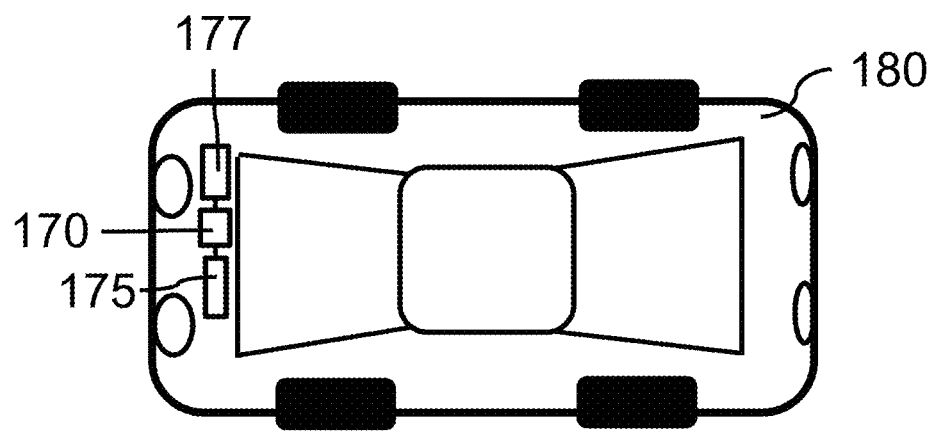
FIG. 9 schematically shows a vehicle.

FIG. 9 shows a vehicle 180. The vehicle 180 may be an electric or hybrid vehicle. The vehicle comprises a battery 175, a device 170 powered by the battery 175 and an electric motor 177. In electric vehicles, at full charge of the battery, a voltage provided by the battery 175 may be in the order of 300 V. When the battery 175 of the electric vehicle is discharged, the voltage supply drop to 200 V. The device 170 may comprise any of the gate drive circuits described above or any of the power module as shown in FIG. 7 or power inverter module as shown in FIG. 8. The device 170 may be used in the vehicle 180 to drive the electric motor 177.

Figure 10:
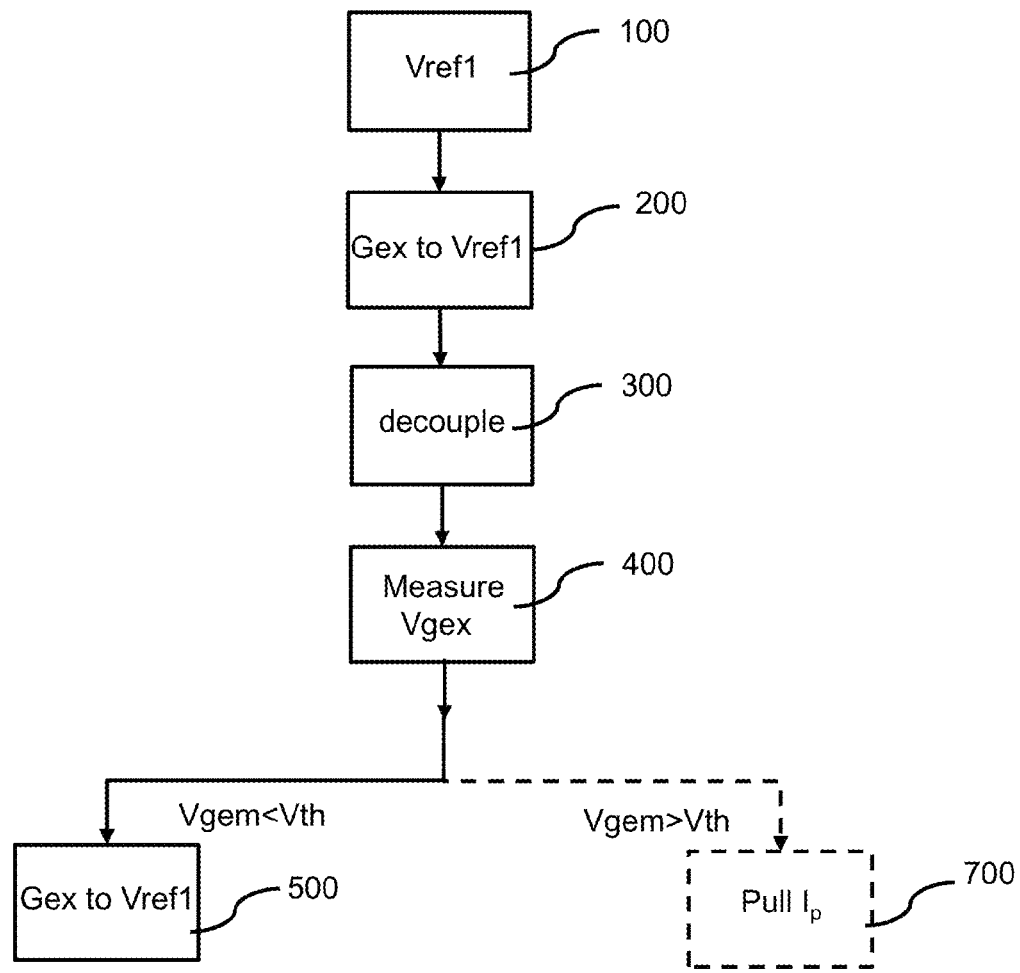
FIG. 10 schematically shows a flow chart of a method of controlling a gate terminal of a power transistor during turn-off of the power transistor.

FIG. 10 shows a flow chart of a method of driving a control terminal Gex of a power transistor 12a. As shown in FIG. 10, the method includes:
a) generating 100 a first reference voltage Vref1,
b) providing 200 to the control terminal Gex the first reference voltage Vref1 to turn off the power transistor 12a such that a discharge current Igd flows through the control terminal Gex of the power transistor 12a when the first reference voltage Vref1 is provided;
c) decoupling 300 the control terminal Gex from the first reference voltage Vref1 during a transition to fully turn-off the power transistor 12a to reduce the discharge current Igd;
d) measuring 400 a measured value Vgem of a voltage Vgex at the gate terminal Gex when the discharge current Igd has reduced to a predetermined current threshold Ith;
e) providing 500 to the control terminal Gex the first reference voltage Vref1 if the measured value Vgem is smaller than a threshold voltage Vth.

The method may be performed e.g. by a gate drive circuit as described above. The method allows to measure the voltage Vgex at the control terminal Gex when substantially zero or low current is flowing from the power transistor 12a through the control terminal Gex, i.e. when the measured value Vgem of the voltage Vgex is close or equivalent to the internal voltage Vge at the internal control terminal Gin of the power transistor 12a. If the predetermined current threshold Ith is substantially 0 A, the measured value Vgem is substantially equivalent to the internal voltage Vge of the power transistor 12a, and a more accurate measurement may be obtained. After measuring 400 the measured value Vgem, the method may optionally further include:
f) pulling out 700 from the control terminal Gex a predetermined current Ip to control the discharge current Igd if the measured value Vgem is larger than the threshold voltage Vth.

Because the circuits implementing the present invention may, for the most part, composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention. For example the switchable current source 80 and the comparator 60 may be implemented in many alternative ways known to those skilled in the art.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between electrically coupled devices may be any type of connection suitable to transfer signals from or to the respective nodes, units or devices, for example via intermediate devices. Accordingly, unless implied or stated otherwise the connections may for example be direct connections or indirect connections. For example in FIGS. 1A, 2, 3A and 4 a dashed line is drawn between the measurement input 3 and an input of the comparator 60 to indicate that there may be other components electrically coupling the measurement input 3 to the input of the comparator 60. These other components are further specified, as way of examples, in the embodiments of FIGS. 5, 6 and 8. Similarly a dashed line is drawn between the control terminal Gex of the power transistor 12a and the drive terminal 1 of the gate drive circuits 10a, 14a, 18a, 22a, 26a, 30a and 3b to indicate that more parasitic components may be present in between.

Any of the gate drive circuits 10a to 30a described through the FIGS. may be integrated in a power module with the respective IGBT 12a. Two power modules may be arranged in a power inverter module configuration as shown in FIG. 8. Any of the gate drive circuits 10a to 30a may be integrated in an integrated circuit chip. The integrated circuit chip may integrate the power module including any of the gate drive circuits 10a to 30a and the IGBT 12a, or the power inverter module as described in FIG. 8.

Although the invention has been described with respect to specific polarity of potentials, skilled artisans appreciated that polarities of potentials may be reversed.

Also for example, the illustrated elements or some of the illustrated elements of the gate drive circuits above described 10a may be located on a single integrated circuit or within a same device. Alternatively, the illustrated elements or some of the illustrated elements above described may include any number of separate integrated circuits or separate devices interconnected with each other.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A gate drive circuit for driving a control terminal of a power transistor, the gate drive circuit comprising:
   a drive terminal for electrically coupling the control terminal,
   a first reference source for generating a first reference voltage,
   a first switch being arranged to electrically couple, when in an on state, the drive terminal to the first reference voltage for turning-off the power transistor,
   a switch control circuit electrically coupled to a first control input of the first switch for controlling the first switch, and
   a measurement circuit having a measurement input connected to the drive terminal for measuring a voltage at the control terminal, and a measurement output connected to a first input of the switch control circuit for supplying a control signal to the switch control circuit;
   the switch control circuit being arranged for, during a transition period of the power transistor to a fully off-state, switching-off the first switch;
   the measurement circuit being arranged:
      for measuring a measured value of the voltage when a discharge current flowing from the control terminal of the power transistor to the drive terminal has been reduced to a predetermined current threshold in response to said switching-off the first switch, and
      for outputting the control signal in response to the measured value for switching-on the first switch if the measured value is smaller than a threshold voltage for bringing the power transistor to the fully off-state.

2. A gate drive circuit as claimed in claim 1, wherein the predetermined current threshold is substantially zero.

3. A gate drive circuit as claimed in claim 1, the measurement circuit being arranged to measure the voltage at the control terminal during a predetermined period of time, a start time of the predetermined period of time coinciding with a point in time the discharge current reduces to the predetermined current threshold.

4. A gate drive circuit as claimed in claim 1, the measurement circuit comprising:
   a threshold voltage source for generating the threshold voltage, and
   a comparator having a first comparator input electrically coupled to the threshold voltage source and a second comparator input electrically coupled to the measurement input for comparing the measured value of the voltage at the control terminal with the threshold voltage and for outputting the control signal.

5. A gate drive circuit as claimed in claim 4, the measurement circuit comprising a low-pass filter arranged between the measurement input and the second comparator input of the comparator for filtering the voltage to obtain the measured value at an input of the comparator.

6. A gate drive circuit as claimed in claim 5, the filter comprising a resistor and a capacitor, a first terminal of the resistor being coupled to the measurement input and a second terminal of the resistor being coupled to a first terminal of the capacitor and to the second comparator input, so as to provide the measured value of the voltage across the capacitor, the capacitor being connected between the second comparator input and ground.

7. A gate drive circuit as claimed in claim 1, further comprising a switchable current source connected in parallel with the first switch for generating a predetermined current, the switch control circuit being connected to a second control input of the switchable current source, and arranged to keep the first switch in the off state and to switch-on the switchable current source if the measured voltage is larger than the threshold voltage.

8. A gate drive circuit as claimed in claim 1, the gate drive circuit further comprising a second reference voltage source for generating a second reference voltage and a second switch electrically coupling, when in an on state, the control terminal to the second reference voltage for turning on the power transistor, the switch control circuit being further connected to a third control input of the second switch for, during the transition period of the power transistor to the fully off state, keeping the second switch in an off state when the first switch is switched off.

9. A gate drive circuit as claimed in claim 1, the first switch being a NMOS device, a source terminal of the NMOS device being electrically coupled to the first reference source and a drain terminal of the NMOS device electrically connected to the drive terminal.

10. A gate drive circuit as claimed in claim 8, the second switch being a PMOS device, a source terminal of the PMOS device being electrically connected to the drive terminal and a drain terminal of the PMOS device being electrically coupled to the second reference source.

11. A gate drive circuit as claimed in claim 1, further comprising a clamp circuitry connected to the first control input of the first switch and the drive terminal for limiting the voltage at the control terminal of the power transistor to a clamped voltage during a reduction of the discharge current to the predetermined threshold.

12. A gate drive circuit as claimed in claim 1, the power transistor being an insulated gated bipolar transistor.

13. A gate drive circuit as claimed in claim 1, the power transistor having an internal control terminal, and said control terminal being electrically coupled to the internal gate terminal through a series arrangement of a parasitic resistor and a parasitic inductor.

14. A power module, comprising the power transistor and a gate drive circuit as claimed in claim 1, the drive terminal being connected to the control terminal of the power transistor to drive the power transistor.

15. A power inverter module, comprising two power modules as claimed in claim 14, the respective two power transistors of the two power modules being connected in series at an output node in an inverter topology.

16. A vehicle comprising:
a device comprising the power inverter module as claimed in claim 15,
a battery being arranged for powering the device, and
an electric motor,
the device being arranged to drive the electric motor.

17. A method of driving a control terminal of a power transistor, the method comprising:
generating a first reference voltage,
providing to the control terminal the first reference voltage to turn-off the power transistor; a discharge current flowing through the control terminal when the first reference voltage is provided;
decoupling the control terminal from the first reference voltage during a transition to fully turn-off the power transistor to reduce the discharge current;
measuring a measured value of a voltage at the control terminal when the discharge current has been reduced to a predetermined current threshold;
providing to the control terminal the first reference voltage if the measured value is smaller than a threshold voltage.

18. A method as claimed in claim 17, further comprising:
pulling out from the control terminal a predetermined current to control the discharge current if the measured value is larger than the threshold voltage.

19. A gate drive circuit as claimed in claim 2, the measurement circuit being arranged to measure the voltage at the control terminal during a predetermined period of time, a start time of the predetermined period of time coinciding with a point in time the discharge current reduces to the predetermined current threshold.

20. A gate drive circuit as claimed in claim 9, the second switch being a PMOS device, a source terminal of the PMOS device being electrically connected to the drive terminal and a drain terminal of the PMOS device being electrically coupled to the second reference source.

* * * * *